United States Patent
Burrows et al.

(10) Patent No.: US 6,274,980 B1
(45) Date of Patent: *Aug. 14, 2001

(54) SINGLE-COLOR STACKED ORGANIC LIGHT EMITTING DEVICE

(75) Inventors: Paul E. Burrows, Princeton Junction; Stephen R. Forrest, Princeton, both of NJ (US)

(73) Assignee: The Trustees of Princeton University, Princeton, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/192,316

(22) Filed: Nov. 16, 1998

(51) Int. Cl.[7] ........................................... H01J 1/62
(52) U.S. Cl. ........................ 313/506; 313/503; 313/504
(58) Field of Search ..................... 313/483, 498, 313/503, 504, 506

(56) References Cited

U.S. PATENT DOCUMENTS

| | | | |
|---|---|---|---|
| 4,689,522 | * 8/1987 | Robertson | 313/506 |
| 5,703,436 | 12/1997 | Forrest et al. . | |
| 5,757,139 | 5/1998 | Forrest et al. . | |
| 5,814,416 | 9/1998 | Dodabalapur et al. . | |
| 5,834,893 | * 11/1998 | Bulovic et al. | 313/506 |
| 5,874,803 | * 2/1999 | Garbuzov | 313/506 |
| 5,917,280 | 6/1999 | Burrows et al. . | |
| 5,998,803 | * 12/1999 | Forrest et al. | 357/40 |

OTHER PUBLICATIONS

U.S. Patent Application Serial No. 08/858,994, filed May 20, 1997, entitled "Saturated Full Color Stacked Organic Light Emitting Devices".

* cited by examiner

Primary Examiner—Nimeshkumar D. Patel
Assistant Examiner—Matthew J. Gerike
(74) Attorney, Agent, or Firm—Kenyon & Kenyon

(57) ABSTRACT

An organic light emitting device (OLED) which emits high intensity light is formed as a stack of individual OLEDs simultaneously emitting light of the same color.

12 Claims, 2 Drawing Sheets

SINGLE-COLOR STACKED ORGANIC LIGHT EMITTING DEVICE

GOVERNMENT RIGHTS

This invention was made with Government support under Contract No. F33615-94-1-1414 awarded by DARPA. The government has certain rights in this invention.

FIELD OF THE INVENTION

The present invention relates to the field of light emitting devices, in particular, to stacked organic light emitting devices (SOLEDs).

BACKGROUND INFORMATION

Organic light emitting devices (OLEDs) are light emitting devices that use organic electroluminescent (EL) materials excited by electric current to emit light. A plurality of OLEDs can be arranged in an array, for example, to form a display.

OLEDs enjoy several advantages over light emitting devices formed with other technologies. Some of the advantages of OLEDs include high efficiency, the ability to emit light from a relatively large area, the use of low cost materials, the ability to use a wide variety of substrates, a wide viewing angle, low voltage operation, direct emission and high reliability.

The intensity of light emitted by an individual OLED, while favorable in comparison to other devices, may be inadequate for certain applications in which higher intensity emission is required or desirable. In such cases, light emitting devices of other technologies are required, thereby losing the aforementioned advantages of OLEDs.

SUMMARY OF THE INVENTION

The present invention is directed to a high brightness organic light emitting device (OLED). The device of the present invention comprises a vertical stack of OLEDs, i.e., a "stacked" OLED (SOLED), in which the OLEDs in the stack simultaneously emit light of the same color.

In an exemplary embodiment of the present invention, a SOLED is formed by stacking two or more "transparent" OLEDs (TOLEDs). A highly reflective electrode is used at one end of the stack. The other end of the stack is substantially transparent, thereby allowing light to be emitted therethrough. The intensity of the light emitted is substantially the sum of the intensities of the emissions of the individual OLEDs. Each OLED in the stack emits substantially the same amount of light it would emit in a stand-alone configuration. However, because at least some of the light emitted from an individual OLED in the stack must travel through one or more other OLEDs in the stack, some light will be absorbed within the device.

The high brightness OLED of the present invention can be used in a wide variety of applications, including computer displays, informational displays in vehicles, television monitors, telephones, printers, illuminated signs, large-area screens and billboards.

DETAILED DESCRIPTION

Figure 1:
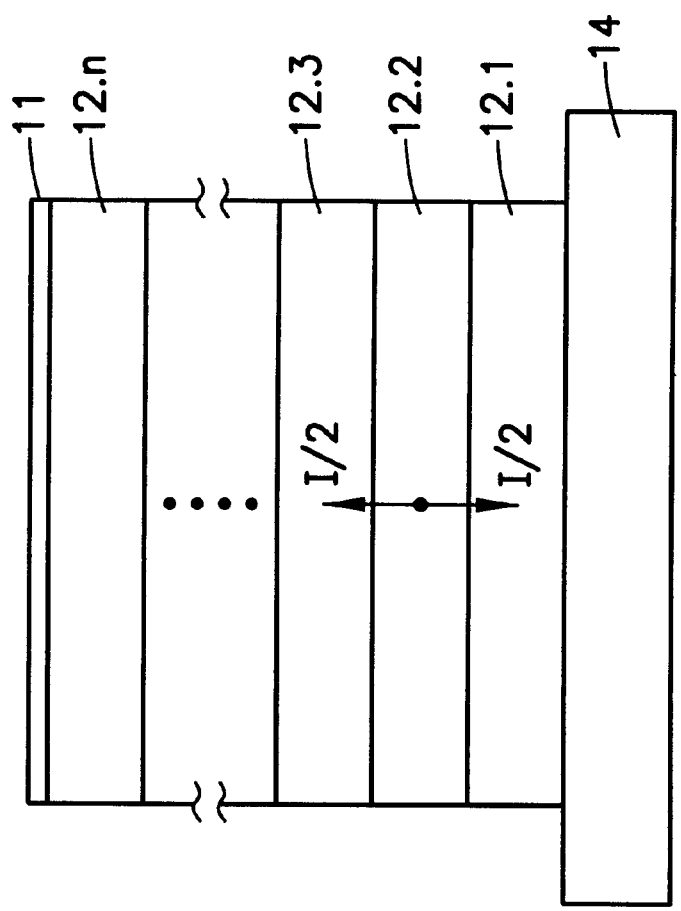
FIG. 1 shows an exemplary embodiment of a high intensity OLED stack in accordance with the present invention.

FIG. 1 shows an exemplary embodiment of a high-intensity organic light emitting (OLED) device 10 in accordance with the present invention. The device 10 comprises n OLEDs, 12.1–12.n arranged vertically in a stack. The OLEDs 12.1–12.n are preferably "transparent" OLEDs (TOLEDs) with substantially transparent electrodes. Such OLEDs are disclosed in U.S. Pat. No. 5,703,436, and incorporated herein by reference in its entirety. The device 10 is formed on a transparent substrate 14 and includes a top electrode 11. The top electrode 11 is preferably highly reflective and is comprised, for example, of a magnesium/silver alloy (Mg:Ag).

As shown in FIG. 1, the light emitted from each OLED 12.x propagates both upwards and downwards with substantially the same intensity in each direction. In other words, if an individual OLED emits light of intensity I, light of intensity substantially I/2 will be emitted upwards in the stacked device 10 and light of intensity substantially I/2 will be emitted downwards in the stacked device 10.

The top electrode 11 can be assumed to be ideally reflective and the substrate 14 can be assumed to be ideally transparent. Furthermore, it can be assumed that the light propagates across the boundaries between each OLED with some non-ideal transmittance (T) which is typically 0.7 (for conventional OLEDs) to 0.95 (for highly transparent OLEDs), depending primarily on the transparency of the electrodes (not shown) of the individual OLEDs.

Assuming each device 12.x emits light with an intensity I and given a transmittance of T between devices, the intensity of light output from the device 10 by each OLED 12.1–12.n can be expressed as follows:

$$I_{12,1} = I/2 + I/2[T^{2(n-1)}] = I/2[1 + T^{2n-2}]$$

$$I_{12,1} = (I/2)T + I/2[T^{(n-2)+(n-1)}] = I/2[T + T^{2n-3}] \ldots$$

$$I_{12,x} = (I/2)T^{x-1} + (I/2)T^{(n-x)+(n-1)} = I/2[T^{x-1} + T^{2n-x-1}] \ldots$$

$$I_{12,n} = IT^{n-1}$$

The total light intensity emitted by the device 10, which is the sum of the components contributed by all OLEDs 12.1–12.n in the stack, can be expressed as follows:

$$I_{TOTAL} = \frac{I}{2}\sum_{j=1}^{n}[T^{j-1} + T^{2n-j-1}] = \frac{I}{2}\left[\frac{T^n + T^{2n-1} - T^{n-1} - 1}{T-1}\right]$$

The improvement in intensity of the stacked device 10 over the intensity of a single OLED device 12.x is:

$$\frac{I_{TOTAL}}{I} = \frac{1}{2}\left[\frac{T^n + T^{2n-1} - T^{n-1} - 1}{T-1}\right]$$

Table 1 tabulates the intensity improvement factor (i.e., $I_{TOTAL}/I$) for several values of transmittance (T) and for several values of n, the number of devices in the stack 10.

TABLE 1

| n | T = 0.7 | T = 0.8 | T = 0.9 |
|---|---------|---------|---------|
| 2 | 1.45 | 1.62 | 1.81 |
| 3 | 1.63 | 2.00 | 2.45 |
| 4 | 1.70 | 2.23 | 2.97 |
| 5 | 1.72 | 2.37 | 3.39 |
| 6 | 1.72 | 2.45 | 3.73 |
| 7 | 1.71 | 2.49 | 3.99 |
| 8 | 1.70 | 2.52 | 4.21 |
| 9 | . | 2.528 | 4.38 |
| 10 | . | 2.531 | 4.52 |
| 11 | . | 2.530 | . |
| . | . | . | . |
| ∞ | 1.67 | 2.5 | 5.0 |

As illustrated by Table 1, for a given transmittance (T), the intensity of light emitted by the stacked device 10 has a maximum at a certain device size (n). For example, for T=0.7, the total light intensity output peaks at n=5 and drops off for larger values of n. This indicates that there is a point of diminishing returns beyond which adding more OLEDs to the stack will not increase the total light intensity emitted from the stack. This point is reached when the losses experienced by the light emitted upwards from the bottom device 12.1 exceeds the contributions from the incremental device 12.n added to the top.

Figure 2:
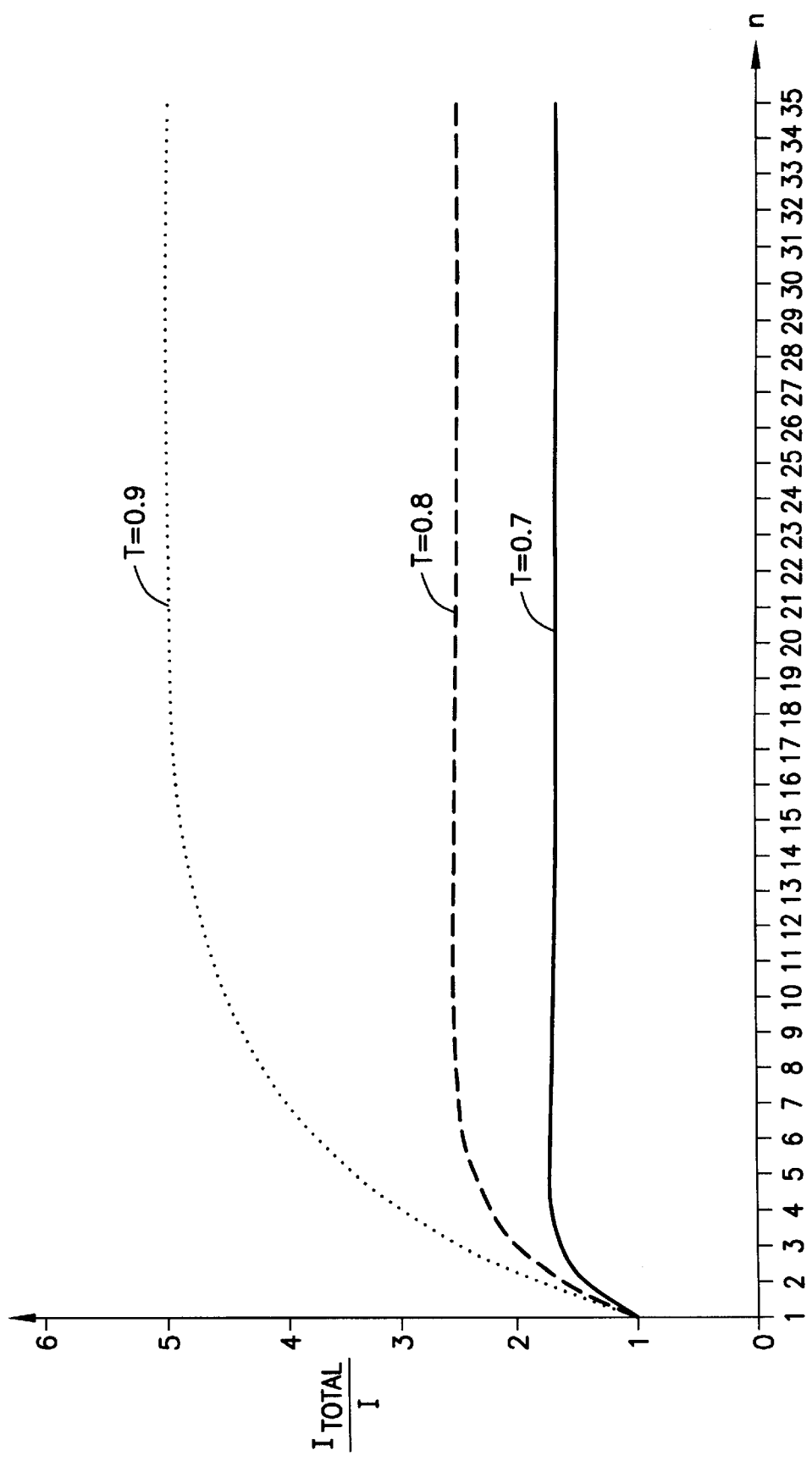
FIG. 2 is a graph illustrating the relationship between the intensity of light emitted by a high intensity OLED stack of the present invention and the number of OLEDs within the stack.

The above-described relationship between the intensity improvement factor and the number (n) of OLEDs in the stack is graphed in FIG. 2 for several different transmittance values. It should be noted that the intensity peaks at higher values of n for higher values of transmittance. For example, for T=0.7, the total intensity output is maximum for a device 10 having five OLEDs. For T=0.8, however, the total light intensity output is maximum for a device 10 having ten OLEDs and for T=0.9, the intensity is maximum for a device having 28 OLEDs (with 5.014 times the intensity of a single OLED).

The efficiency of the stacked device 10 can be expressed in terms of the efficiency of the individual OLEDs as follows:

$$\eta_{SOLED} = \left(\frac{I_{TOTAL}}{nI}\right)\eta_{OLED} = \frac{\eta_{OLED}}{2n}\left[\frac{T^n + T^{2n-1} - T^{n-1} - 1}{T - 1}\right]$$

In accordance with the above expression, the efficiency of the stacked device 10 will be less than that of an individual OLED 12.x in the stack. This is due to the losses experienced by that light emitted by each OLED 12.x which must travel through another OLED in the stacked device 10 in order to be emitted from the stacked device.

Table 2 tabulates the ratio of the efficiency of the stacked device 10 to that of an individual OLED 12.x (i.e., $\eta_{SOLED}/\eta_{OLED}$) for various values of transmittance and for various values of n.

TABLE 2

| n | T = 0.7 | T = 0.8 | T = 0.9 |
|---|---------|---------|---------|
| 2 | 0.72 | 0.81 | 0.90 |
| 3 | 0.54 | 0.67 | 0.82 |
| 4 | 0.43 | 0.56 | 0.74 |
| 5 | 0.34 | 0.47 | 0.68 |
| 6 | 0.29 | 0.41 | 0.62 |
| 7 | 0.24 | 0.36 | 0.57 |
| 8 | 0.21 | 0.31 | 0.53 |
| 9 | 0.19 | 0.28 | 0.49 |
| 10 | 0.17 | 0.25 | 0.45 |
| 11 | 0.15 | 0.23 | 0.42 |
| ∞ | 0 | 0 | 0 |

As Table 2 makes clear, the efficiency of the stacked device drops monotonically as the number of devices in the stack increases. Thus, a stacked device 10 comprising five OLEDs, each with a transmittance of 0.8 will generate 2.37 times the brightness of an individual OLED (see TABLE 1), but with only 47% of the efficiency of the individual OLED.

It should be noted that microcavity effects can come into play which could affect the color and directionality of the light output by the device 10. Such effects are described in U.S. Pat. No. 5,932,895, and incorporated by reference herein in its entirety. Furthermore, the thicknesses of various layers can be manipulated accordingly to provide a dielectric stack that narrows the emitted linewidth.

The device 10 of the present invention can be powered as disclosed in U.S. Pat. No. 5,757,139, and incorporated by reference herein in its entirety. In the alternative, the stacked device 10 can be formed in accordance with the stacked structures disclosed in U.S. Pat. No. 5,917,280, and incorporated by reference herein in its entirety.

What is claimed is:

1. A stacked organic light emitting device comprising:
   a plurality of organic light emitting devices arranged vertically, wherein the organic light emitting devices emit light of substantially the same color; and
   a first electrode arranged at a first end of the stacked organic light emitting device, wherein the electrode is substantially reflective,
   a second electrode arranged at a second end of the stacked organic light emitting device, wherein the electrode is substantially transparent,
   wherein light emitted from the second end of the stacked organic light emitting device is of substantially the same said color and is brighter than the light emitted from each of the plurality of organic light emitting devices.

2. The stacked organic light emitting device of claim 1, wherein each of the plurality of organic light emitting devices includes a substantially transparent electrode.

3. The stacked organic light emitting device of claim 1, wherein the plurality of organic light emitting devices includes a first organic light emitting device arranged adjacent to the first end of the stacked organic light emitting device and a second organic light emitting device arranged adjacent to the second end of the stacked organic light emitting device, and wherein a light emitted from the first organic light emitting device is greater than a light emitted from the second organic light emitting device and absorbed within the stacked organic light emitting device.

4. The stacked organic light emitting device of claim 1, incorporated in a display.

5. The stacked organic light emitting device of claim 1, incorporated in a vehicle.

6. The light emitting device of claim 1, incorporated in a television.

7. The light emitting device of claim 1, incorporated in a computer.

8. The light emitting device of claim 1, incorporated in a printer.

9. The light emitting device of claim 1, incorporated in a screen.

10. The light emitting device of claim 1, incorporated in a sign.

11. The light emitting device of claim 1, incorporated in a telecommunications device.

12. The light emitting device of claim 1, incorporated in a telephone.

* * * * *

UNITED STATES PATENT AND TRADEMARK OFFICE
CERTIFICATE OF CORRECTION

PATENT NO.    : 6,274,980 B1
DATED         : August 14, 2001
INVENTOR(S)   : Burrows et al.

It is certified that error appears in the above-identified patent and that said Letters Patent is hereby corrected as shown below:

Column 2,
Line 46, change "+$T^{2n-n-1}$]" to -- +$T^{2n-x-1}$] --.

Signed and Sealed this

Twenty-fourth Day of September, 2002

Attest:

JAMES E. ROGAN
Attesting Officer                    Director of the United States Patent and Trademark Office